United States Patent
Chen et al.

(10) Patent No.: US 8,143,602 B2
(45) Date of Patent: Mar. 27, 2012

(54) HIGH-VOLUME MANUFACTURING MASSIVE E-BEAM MASKLESS LITHOGRAPHY SYSTEM

(75) Inventors: Jeng-Horng Chen, Hsin-Chu (TW);
Shy-Jay Lin, Hsinchu County (TW);
Burn Jeng Lin, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 282 days.

(21) Appl. No.: 12/411,229

(22) Filed: Mar. 25, 2009

(65) Prior Publication Data

US 2010/0248158 A1    Sep. 30, 2010

(51) Int. Cl.
*G21K 5/08*    (2006.01)
(52) U.S. Cl. ............. 250/492.1; 250/492.2; 250/492.22; 250/492.23; 250/492.3; 355/18; 355/67; 355/70
(58) Field of Classification Search ............... 250/492.1, 250/492.2, 492.22, 492.23, 492.3; 355/18, 355/67, 70
See application file for complete search history.

(56) References Cited

U.S. PATENT DOCUMENTS

| 6,341,007 B1 * | 1/2002 | Nishi et al. ........................ 355/53 |
| 6,498,685 B1 * | 12/2002 | Johnson ........................ 359/626 |
| 7,795,601 B2 * | 9/2010 | Lin et al. ..................... 250/492.2 |
| 7,851,774 B2 * | 12/2010 | Lin et al. ................... 250/492.22 |
| 2005/0102723 A1 * | 5/2005 | Van Den Nieuwelaar et al. ................................ D18/1 |
| 2007/0278424 A1 * | 12/2007 | Lin et al. .................... 250/492.2 |

OTHER PUBLICATIONS

Jack J. H. Chen, "Multiple Electron Beam Maskless Lithography for High-Volume Manufacturing", Taiwan Semiconductor Manufacturing Company, Ltd. 3 pages.
Unpublished U.S. Appl. No. 13/217,345, filed Aug. 25, 2011, entitled "Geometric Pattern Data Quality Verification for Maskless Lithography," 27 pages.
Unpublished U.S. Appl. No. 13/225,617, filed Sep. 6, 2011, entitled "Striping Methodology for Maskless Lithography," 34 pages.

* cited by examiner

*Primary Examiner* — Michael Maskell
(74) *Attorney, Agent, or Firm* — Haynes and Boone, LLP

(57) ABSTRACT

The present disclosure provides a maskless lithography apparatus. The apparatus includes a plurality of writing chambers, each including: a wafer stage operable to secure a wafer to be written and a multi-beam module operable to provide multiple radiation beams for writing the wafer; an interface operable to transfer wafers between each of the writing chambers and a track unit for processing an imaging layer to the wafers; and a data path operable to provide a set of circuit pattern data to each of the multiple radiation beams in each of the writing chambers.

20 Claims, 7 Drawing Sheets

_US 8,143,602 B2_

HIGH-VOLUME MANUFACTURING MASSIVE E-BEAM MASKLESS LITHOGRAPHY SYSTEM

BACKGROUND

Semiconductor integrated circuit (IC) technology is continually progressing to circuit layouts having smaller feature sizes as well as increased density. As a result of this continuous progression, photolithography equipment has continually become more expensive and more complex. Particularly, when e-beam is used to pattern semiconductor substrate, the processing time is very long and the productivity is very low. Continued improvements to lithography equipment and throughput are therefore desired.

SUMMARY

One of the broader form of an embodiment of the present invention involves a maskless lithography apparatus. The apparatus includes a plurality of writing chambers, each including: a substrate stage operable to secure a substrate to be written, a multi-beam module operable to provide multiple radiation beams each directed for writing a portion of the substrate, and a load lock operable to provide the substrate to the substrate stage; an interface operable to transfer the substrate to the substrate stage of the respective writing chamber; a data path operable to provide a set of circuit pattern data to the multi-beam module of each of the writing chambers; and a clock module operable to provide a clock signal to the multi-beam module of each of the writing chambers for synchronization.

Another one of the broader form of an embodiment of the present invention involves a plurality of writing chambers, each including: a wafer stage operable to secure a wafer to be written and a multi-beam module operable to provide multiple radiation beams for writing the wafer; an interface operable to transfer wafers between each of the writing chambers and a track unit for processing an imaging layer to the wafers; and a data path operable to provide a set of circuit pattern data to each of the multiple radiation beams in at least two of the writing chambers.

Yet another one of the broader form of an embodiment of the present invention involves a method for patterning a plurality of substrates. The method includes forming an imaging layer on each of the substrates, the imaging layer being sensitive to a radiation energy; transferring the substrates to a maskless lithography apparatus including: a plurality of writing chambers each having a multi-beam module configured to provide multiple radiation beams of the radiation energy, each of the multiple radiation beams being directed for writing a portion of a substrate and a data path configured to provide a set of circuit pattern data to the multi-beam module of each of the writing chambers; providing the set of circuit pattern data through the data path to the multi-beam module of each of the writing chambers; and simultaneously writing to each of the substrates by the respective multi-beam module in accordance with the set of circuit pattern data.

BRIEF DESCRIPTION OF THE DRAWINGS

The present disclosure is best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion. Furthermore, all features may not be shown in all drawings for simplicity.

DETAILED DESCRIPTION

The present disclosure relates generally to lithography systems and a method of utilizing such systems. It is understood, however, that the following disclosure provides many different embodiments, or examples, for implementing different features of the invention. Specific examples of components and arrangements are described below to simplify the present disclosure. These are, of course, merely examples and are not intended to be limiting.

Figure 1:
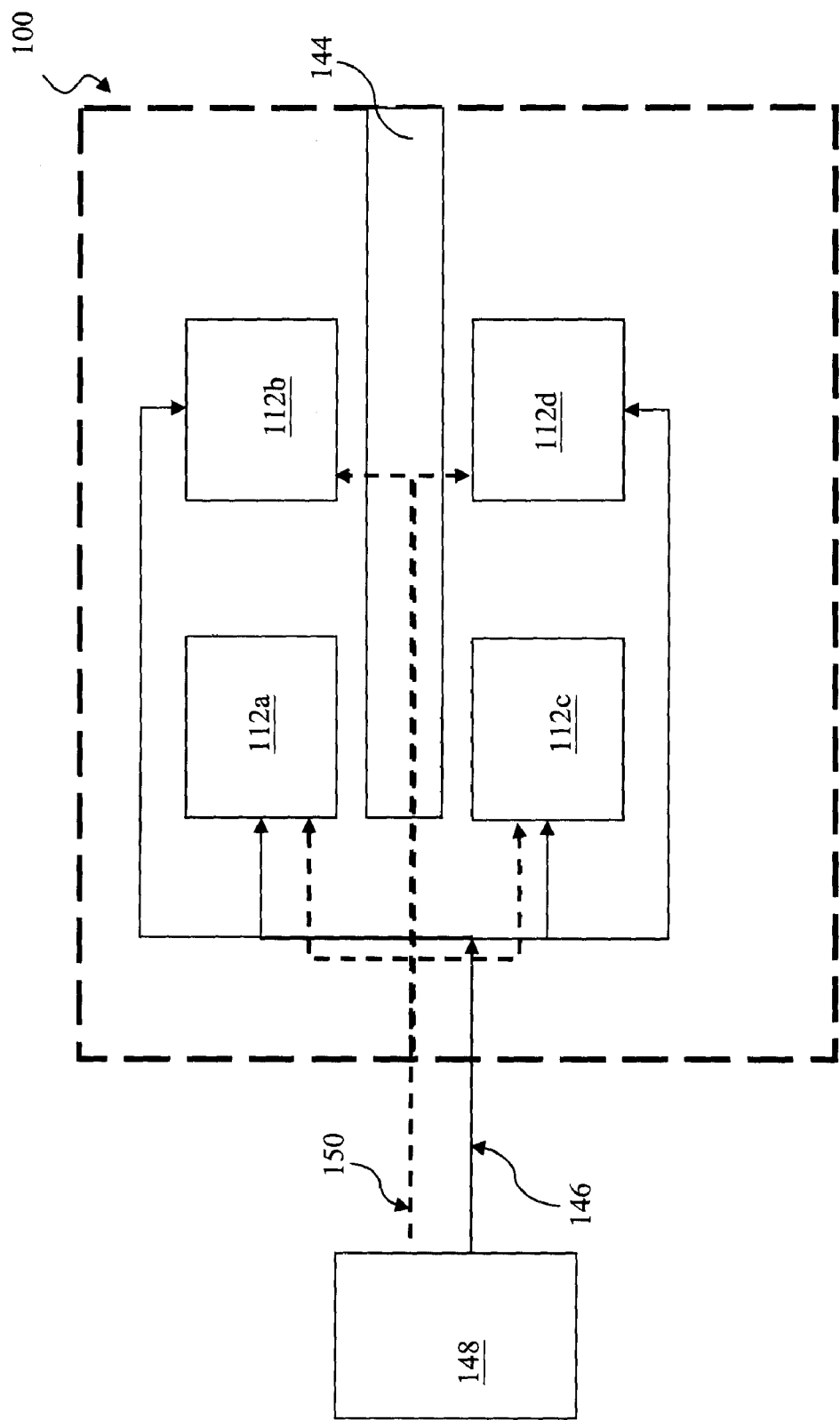
FIG. 1 is a schematic view of one embodiment of a maskless lithography apparatus constructed according to various aspects of the present disclosure.

Referring to FIG. 1, illustrated is a schematic view of one embodiment of a maskless lithography apparatus 100. The lithography apparatus 100 has a plurality of writing chambers, each being designed to provide multiple radiation beams, and a circuit data path to provide circuit pattern data to each of the writing chambers, as discussed in greater detail below.

Figure 2:
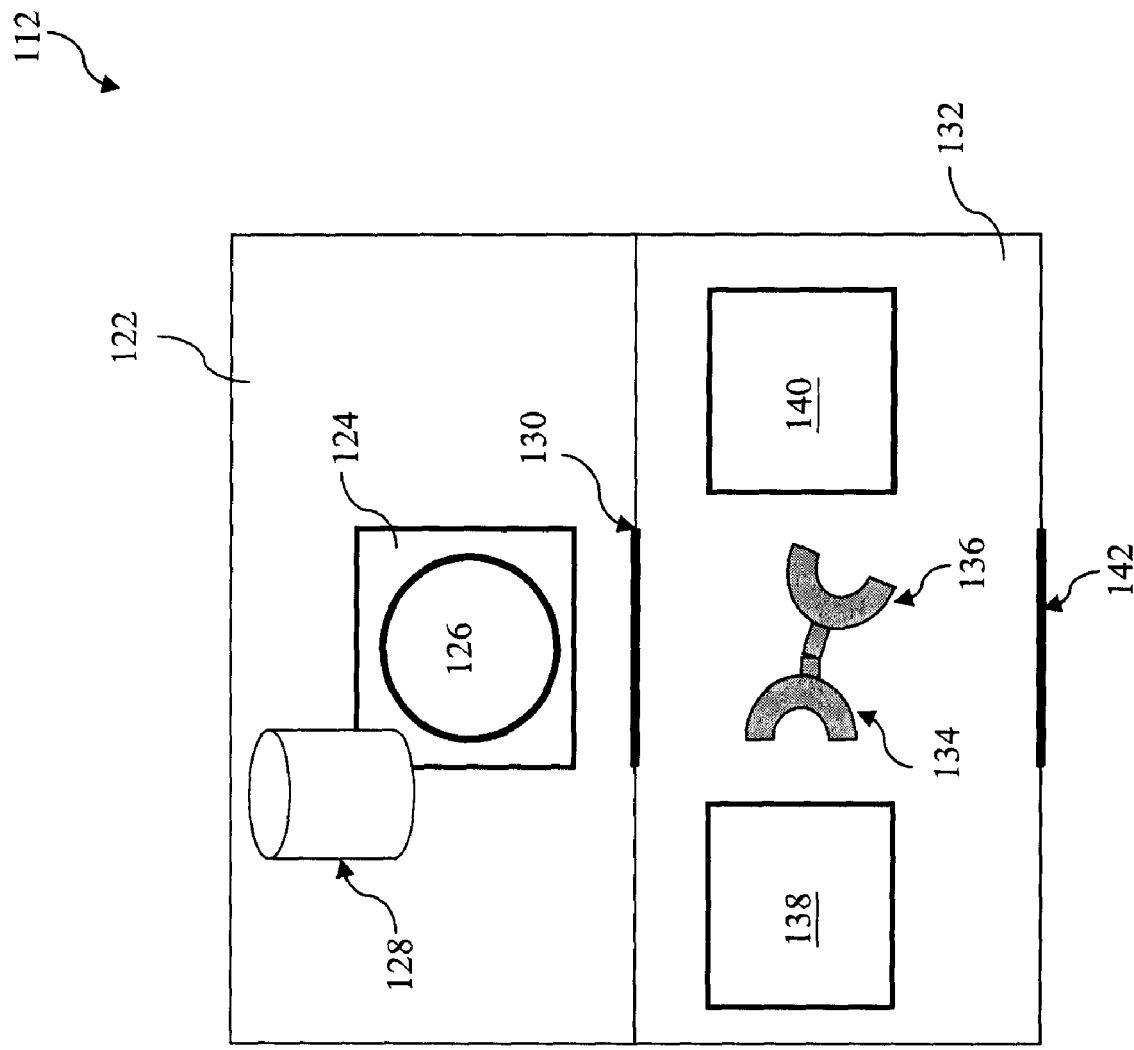
FIG. 2 is a schematic view of an exemplary embodiment of a writing chamber implemented in the maskless lithography apparatus of FIG. 1 constructed according to various aspects of the present disclosure.

The maskless lithography apparatus 100 includes a plurality of writing chambers (scanning or patterning chambers) 112 to pattern wafers. In this exemplary embodiment, the maskless lithography apparatus 100 includes writing chambers 112a, 112b, 112c, and 112d that are integrated together. Each writing chamber 112a-d is substantially identical in terms of structure and is further described with reference to FIG. 2. Referring also to FIG. 2, the writing chamber 112 includes a main (vacuum) chamber 122 for patterning (or writing). The main chamber 122 has a wafer stage 124 designed operable to secure and manipulate a substrate (or a wafer) 126 during the patterning process. The wafer is coated with an imaging layer sensitive to a radiation energy. In one embodiment, the radiation energy includes an electron beam. The main chamber 122 may further include various vacuum pumps (not known) to maintain the main vacuum chamber in a certain low pressure level for the writing process.

The main chamber 122 includes a multi-beam module 128 to provide multiple radiation beams to write the wafer 126. For example, the multiple radiation beams are directed to different regions (fields) of the wafer 126 such that each radiation beam is operable to write a pattern to a field of the wafer. In one embodiment, the multi-beam module 128 includes a multi-column cell having multiple columns integrated together. For example, the multi-column cell includes a set of micro-columns configured and spaced to be operable for simultaneously multiple beams writing to the wafer. Each column of the multi-column cell may include a source to supply the radiation energy (energy beam). As noted earlier, the radiation energy includes an electron beam (e-beam) in one embodiment. For example, the electron beam source includes a electron gun of thermionic type or field emission type. Each column also includes a condenser lens system to redistribute the electron beam from the source. Each column also includes a scan deflector, such as an electrostatic deflector, to control the scan in a scanning mode either raster scan or vector scan. Each column also includes an objector lens, such as electromagnetic poles and/or electrostatic feature, to project the electron beam to the wafer. The multiple columns may share one electron source integrated to provide multiple electron beams. Alternatively, the multi-beam module 128 may include a single column designed operable to control multiple electron beams for the scan. For example, the single column is configured operable to direct the multiple electron beams to different fields and control the multiple electron beams for scan in a synchronization mode.

The main chamber 122 may be additionally configured with various sensors (not shown), such as alignment sensors to monitor and assist with alignment and/or leveling sensors to monitor the leveling. The main chamber 122 also includes a gate 130 to a load lock chamber (or loadlock) 132 of the writing chamber 112 for wafer transferring. The loadlock 132 includes a robot to send a wafer to the main chamber through the gate 130 and/or receive a wafer from the main chamber through the gate 130. In another embodiment, the loadlock 132 includes two wafer handling robots 134 and 136 for efficient wafer transferring. The loadlock 132 may also include a wafer stage for pre-alignment. The loadlock may further include one or more sensors, such as pre-alignment sensor(s), to assist the process of the wafer pre-alignment. In another embodiment, the loadlock 132 includes two wafer stages 138 and 140 properly configured for efficient wafer transferring. The loadlock 132 further includes a second gate 142 to receive a wafer for writing or send a wafer out after the writing. The loadlock may also include one or more pumps configured to maintain the pressure of the loadlock chamber at a proper level.

According to various embodiments, the radiation energy may alternatively include an ion beam, an ultra-violet (UV) beam, or an extreme ultra-violet (EUV) beam. The wafer 126, to be patterned, may be a semiconductor wafer having silicon, germanium, diamond, or a compound semiconductor. Alternatively, it can be other type substrate such as glass for thin-film transistor liquid crystal display (TFT_LCD) devices or fused silicon/calcium fluoride for photomask. The wafer 126 may include a plurality of layers formed thereon, each having patterned structures. The wafer 126 is coated with an imaging layer sensitive to the radiation energy used in the patterning process. For example, the imaging layer is sensitive to electron beam, ion beam, UV beam, or EUV beam. As one example illustrated in FIG. 3, the wafer 126 includes various a plurality of regions (fields) 152 the circuit pattern provided in the set of the circuit pattern data (a circuit data file or a writing data file) can be written to each of the fields by implementing the multiple beams and the set of circuit pattern data from the data path. The multiple beams are controlled to simultaneously write the circuit pattern to multiple fields. In one example, a field size is about 26 mm×33 mm or less.

Referring back to FIG. 1, the maskless lithography apparatus 100 includes an interface 144 designed as an interface between the plurality of writing chambers 112 and a track unit (not shown) coupled with the maskless lithography apparatus. The track unit is designed for implementing various processes to wafer and the imaging layer on the wafer. In one embodiment, the track unit is integrated with the maskless lithography apparatus for efficient wafer lithography processes. In one example, these processes to the imaging layer and the substrate may include coating the substrate with the image layer, baking the imaging layer, and developing the imaging layer. The interface may include a main robot (not shown) designed operable to transfer substrates between the track unit and each of the writing chambers. In various embodiments, the maskless lithography apparatus 100 may further include a buffer space in the interface, in the track unit, or in an area between the interface and the track unit to store substrate to be transferred into or out from the maskless lithography apparatus 100.

In one embodiment, the various main chambers, loadlock chambers, and the interface may be maintained at different pressure levels. For example, the loadlock chamber may be maintained at a pressure level higher than that of the main chamber. The interface may be maintained at the atmospheric pressure. In another embodiment, the interface is maintained at a low vacuum state with a pressure higher that that of the loadlock chambers.

The maskless lithography apparatus 100 further includes a data path 146 to transfer a set of circuit pattern data from a data server 148 to the maskless lithography apparatus 100. The set of circuit pattern data has the information of integrated circuit pattern to be imaged on the substrate, specifically, to be formed on the imaging layer on wafers each in one of the plurality of writing chambers. The data path may include proper physical features for data communication. For example, the data path 146 includes an optical fiber to implement data communication between the data server 148 and the maskless lithography apparatus 100. Because only one data path is integrated to the cluster tool 100, the set of circuit pattern data is sent through the data path and is further shared by the plurality of writing chambers 112. By sharing one data server and one data path among a plurality of multi-beam modules, the data communication cost is reduced and the lithography patterning throughput is substantially improved. In another embodiment, the tool overhead, such as alignment and/or vacuum, is also substantially reduced. In one embodiment, the set of circuit pattern data is distributed to each of the plurality of writing chambers. In another embodiment, the set of circuit pattern data is further shared by each of the multiple beams, such as by multi-columns in each of writing chambers. Additionally, the maskless lithography apparatus 100 may include a buffer database (not shown) to store a portion of the set of circuit pattern data before it is distributed to the plurality of writing chambers 112. For example, a dynamic random access memory (DRAM) media may be used to store the circuit pattern data. The maskless lithography apparatus 100 may include a set of computing power, which can be field programmable gate-array (FPGA), graphics processing unit (GPU), central processing unit (CPU) or any other application-specific integrated circuit (ASIC) solution, to decompress, demultiplex the layout data and add in corrections for the process- and equipment-induced CD, overlay and stitching error in real time. In one embodiment, the apparatus includes two sets of buffer databases, one being used for the current writing and the another one is used for loading a next set of circuit pattern data. The data server 148 is a data center, such as a computer with a data storage, to store integrated circuit design data (such as tapeout data) and to provide a proper circuit design data to the maskless lithography apparatus. The data server 148 may include a central processing unit (CPU), random access memory (RAM), and other proper modules. In another embodiment, the data server 148 includes a storage media large enough to store various pattern designs of different circuit designs.

In one embodiment, the maskless lithography apparatus 100 further includes a clock module 150 coupled to the plurality of the writing chambers and a mechanism to provide a clock signal through a clock wire to the plurality of writing chambers of the maskless lithography apparatus to synchronize the writing processes of the plurality of writing chambers and the wafer stages in the main chambers, such that the set of circuit pattern data can be written to various wafers respectively by the writing chambers and, furthermore, written to various fields of each wafer in a synchronization mode. The clock signal can be provided from the data server or alternatively provided from other proper control module integrated with or coupled with the maskless lithography apparatus 100. In one example, the clock signal can be generated by a circuit. In another example, the clock signal can be generated by a circuit based on an intrinsic frequency of quartz crystal oscillation.

In another embodiment, each writing chamber may additionally include a chamber database to store a portion of the circuit pattern data. In another embodiment, the maskless lithography apparatus 100 further includes a computer (not shown) integrated inside or distributed at various location. The computer is connected to the control various processing functions of the apparatus 100.

Figure 4:
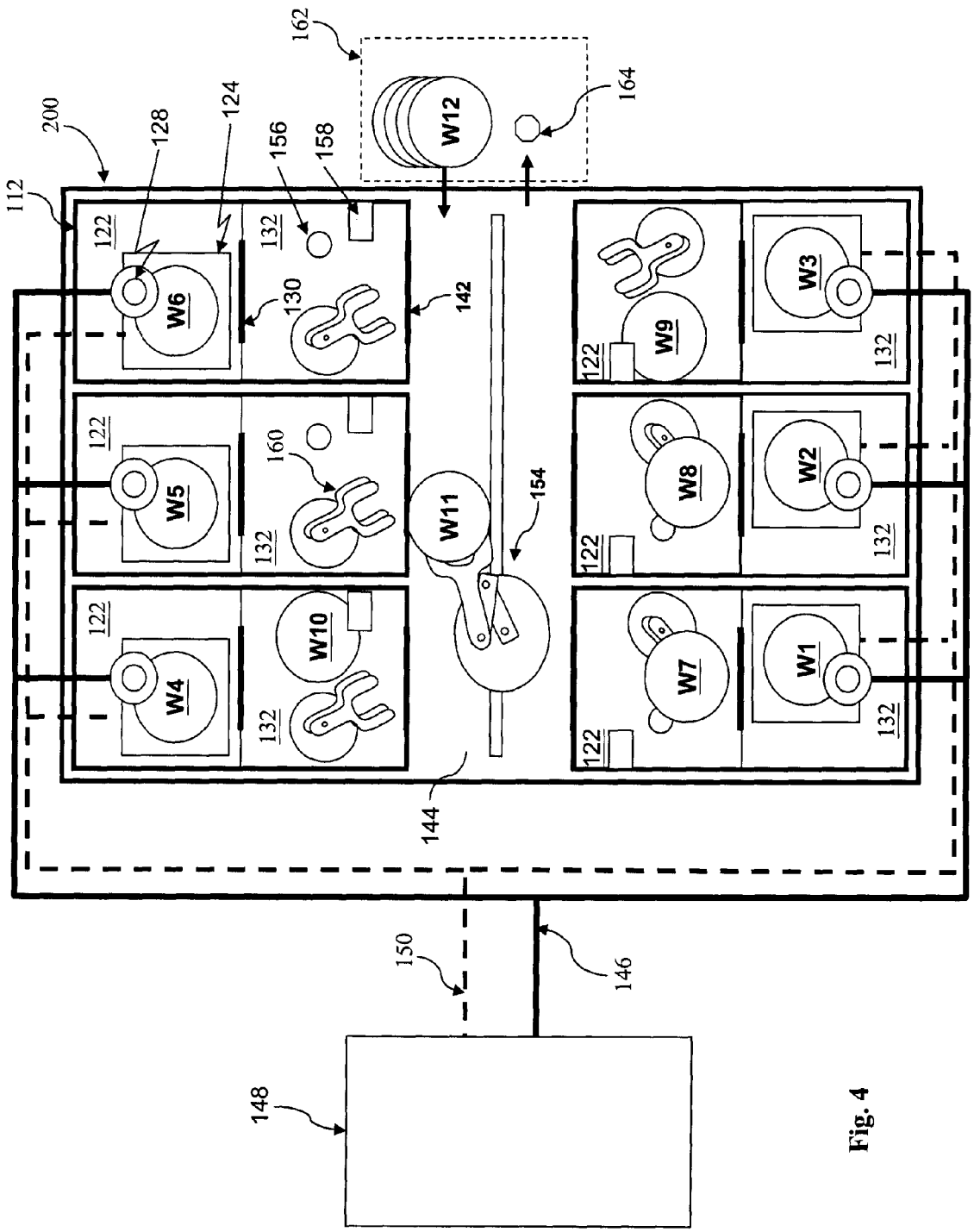
FIG. 4 is a schematic view of another embodiment of a maskless lithography apparatus constructed according to various aspects of the present disclosure.

FIG. 4 is a schematic view of another embodiment of a maskless lithography apparatus 200 constructed according to various aspects of the present disclosure. The maskless lithography apparatus 200 is similar to the maskless lithography apparatus of FIGS. 1 and 2. Accordingly, similar features in FIGS. 1, 2, and 4 are numbered the same for the sake of simplicity and clarity. The maskless lithography apparatus 200 includes an interface 144 coupled with a track unit for various processes to the wafers and the imaging layer on each wafer. The interface 144 further includes a main robot 154 designed operable to transfer wafers to and from a plurality of writing chambers 112. In another embodiment, the maskless lithography apparatus 200 further includes a buffer area 162 to store wafers from the track unit and/or to the track unit. The buffer area 162 may include a sensor 164 to check, count, or monitor the wafers in the buffer area.

In this exemplary embodiment, the maskless lithography apparatus 200 includes six writing chambers 112 configured adjacent to the interface 144 so that all the writing chambers can directly exchange wafers with the interface 144. The writing chambers can be arranged horizontally adjacent to each other, or vertically stacked to further reduce the footprint. It is understood that the number of writing chambers may vary depending on the type of equipment used. The writing chambers 112 are substantially similar to those of FIGS. 1 and 2. Each of the writing chambers has a mechanism to provide multiple beams for wafer scanning. For example, each of the writing chambers 112 includes a main chamber 122 and a loadlock chamber 132. In one embodiment, the main chamber 122 includes a multi-beam column 128 to provide multiple beams for writing to an imaging layer on the wafer to be patterned. The loadlock chamber 132 includes a pre-alignment wafer stage 156 (or chuck) to pre-align a wafer. The loadlock may further include a pre-alignment sensor 158 to monitor and assist the wafer pre-alignment. The loadlock further includes a robot 160 for transferring wafers between the associated main chamber and the interface. In FIG. 4, the labels "W1", "W2", ... and "W12" represent various wafers to be processes by the maskless lithography apparatus 200.

The maskless lithography apparatus 200 includes a data path 146 connected to the data server 148 to provide a set of circuit pattern data to be shared by each of the writing chambers 112. In another embodiment, the maskless lithography apparatus 200 also includes a clock module to provide a clock signal to synchronize the scanning of the writing chambers 112. The maskless lithography apparatus 200 may further include one buffer database to store a portion of the circuit pattern data and may alternatively or additionally include multiple buffer databases each being incorporated in one of the writing chambers for saving at a portion of distributed circuit pattern data.

Figure 5:
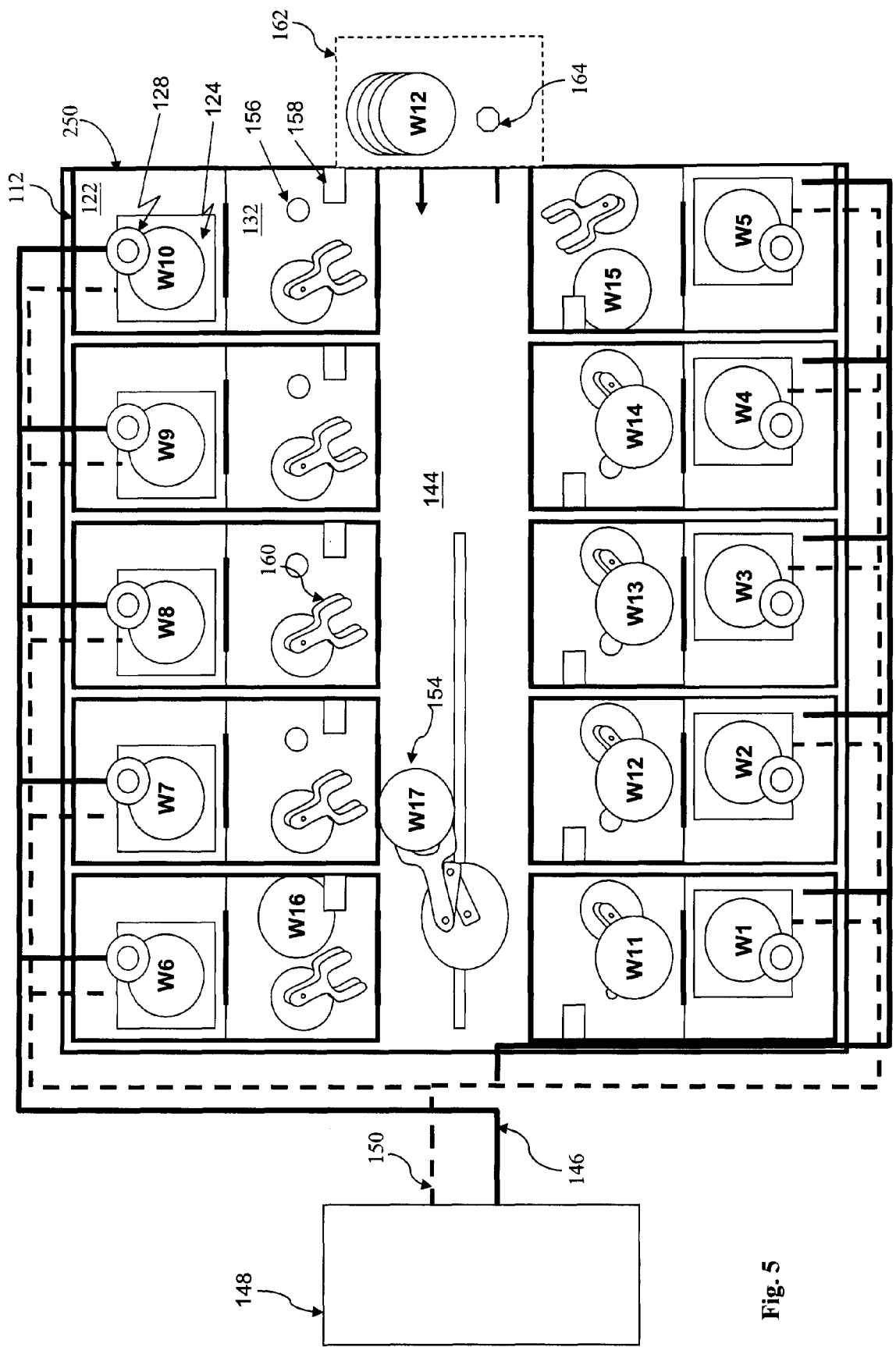
FIG. 5 is a schematic view of another embodiment of a maskless lithography apparatus constructed according to various aspects of the present disclosure.

FIG. 5 is a schematic view of another embodiment of a maskless lithography apparatus 250 constructed according to various aspects of the present disclosure. The maskless lithography apparatus 250 is similar to the maskless lithography apparatuses of FIGS. 1, 2 and 4. Accordingly, similar features in FIGS. 1, 2, 4 and 5 are numbered the same for the sake of simplicity and clarity. The maskless lithography apparatus 250 includes ten exemplary writing chambers 112 configured around and adjacent an interface 144. Each writing chamber has a mechanism to provide multiple radiation beams for wafer scanning and is substantially similar to those of the writing chambers of FIG. 4, FIG. 1, or FIG. 2. The maskless lithography apparatus 250 also includes a data path 146 to provide a set of circuit pattern data and may further include a clock module to provide a clock signal to the maskless lithography apparatus for scanning synchronization. As one advantage of the maskless lithography apparatus 250 in the present embodiment, the tool productivity is ensured. For example, if one writing chamber is down, the productivity loss is 10% of the whole apparatus. The other 9 writing chambers still have full productivity. In another embodiment, if one multi-beam column has a throughput of about 10 wafers per hour (wph), then the maskless lithography apparatus 250 can have a throughput of about 100 wph. Thus, the apparatus can be linked to a 100-wph inline track unit. In this case, both the track unit and the maskless lithography apparatus are fully exploited.

Figure 6:
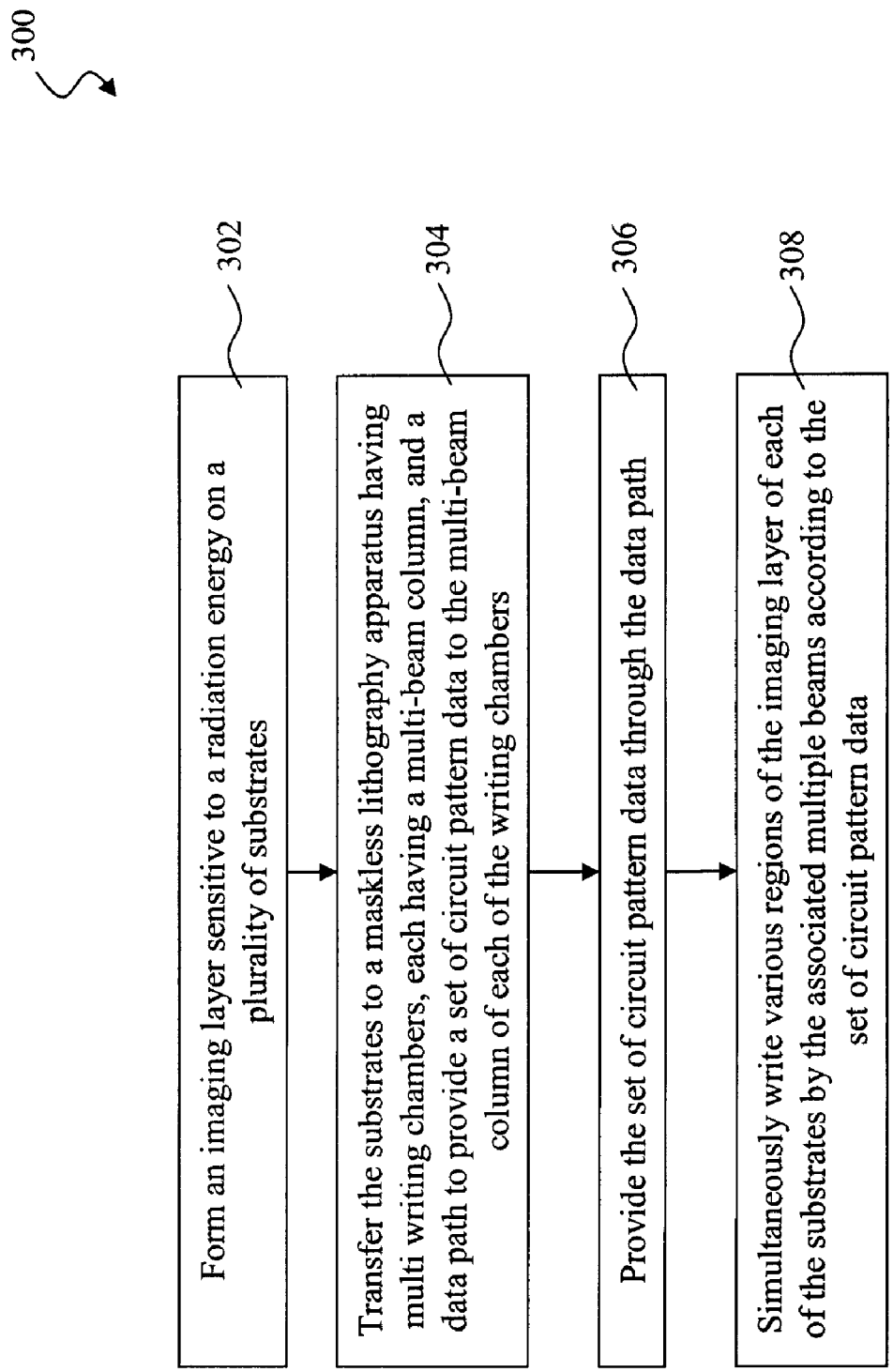
FIG. 6 is a flow chart of one embodiment of a method utilizing the lithography apparatuses of FIG. 1, 4, or 5.

FIG. 6 is a flowchart of one embodiment of a method 300 utilizing the maskless lithography apparatus of FIG. 1 or that of FIG. 4 or FIG. 5 for wafer patterning. Referring to FIG. 6, FIG. 1, the method 300 begins at step 302 by forming an imaging layer on a plurality of substrates to be patterned, one by one or alternatively in batch. In one embodiment, the substrates are coated with the imaging layer by a technique such as spin coating.

Figure 3:
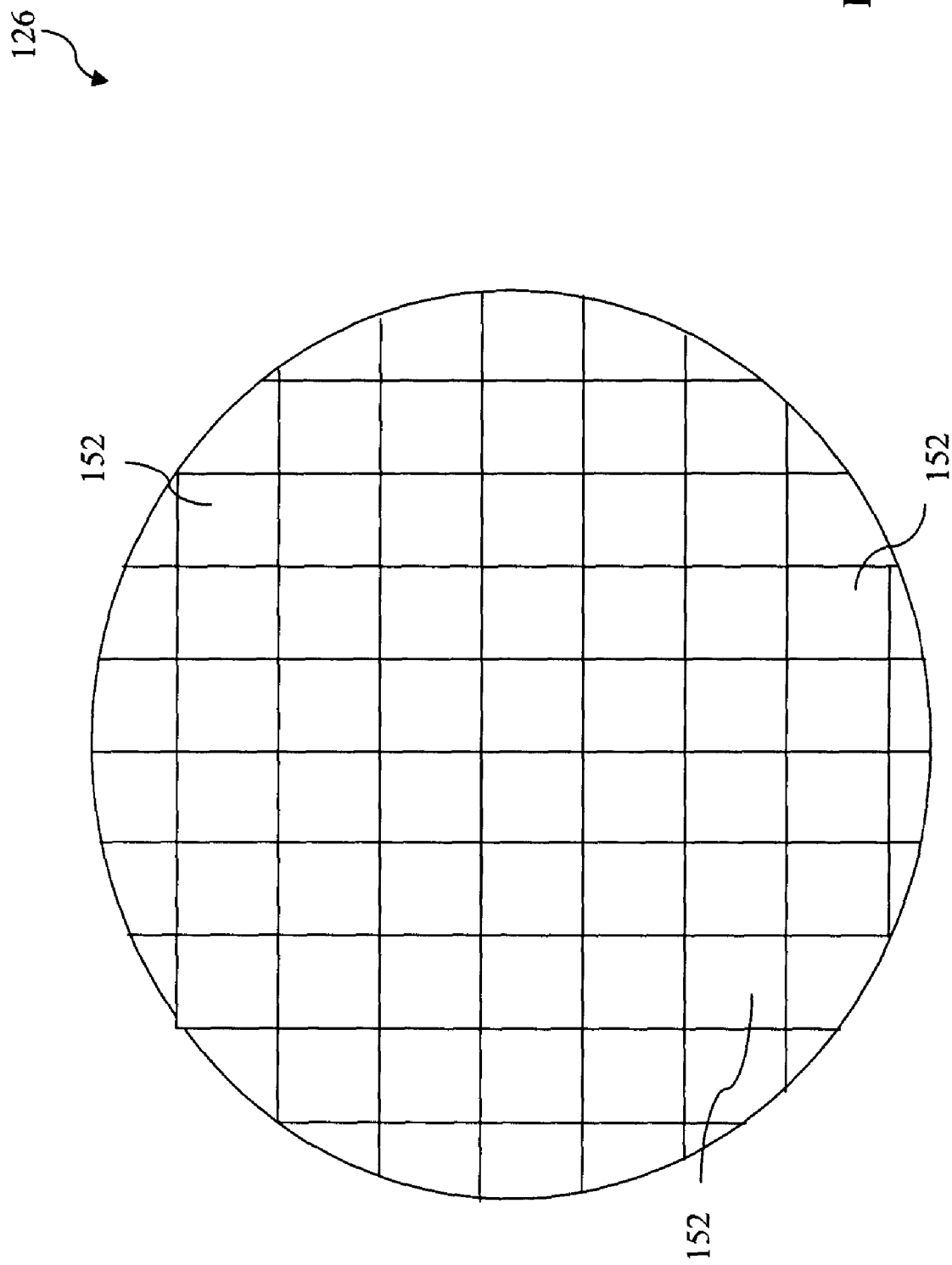
FIG. 3 is a top view of one embodiment of a semiconductor wafer to be processed in the lithography apparatus of FIG. 1.

In one example, the substrates are semiconductor wafers. FIG. 3 illustrates an exemplary semiconductor wafer 126. The wafer 126 includes a plurality of regions 152, referred to as fields. During a lithography process, the wafer 126 is scanned for multiple fields at a time. One field may include one or more die disposed therein. Alternatively, the substrate may include other substrates to be patterned such as a glass substrate for thin-film transistor liquid crystal display (TFT LCD) devices or fused quartz/calcium fluoride substrate for mask. The wafer 126 may further include multiple patterned layers formed therein and/or thereon such as doped regions, shallow trench isolation (STI), polysilicon gates, and metal lines and vias. The semiconductor wafers, or other type of substrates, include a material layer to be patterned by a proper technique, such as etching, using the patterned imaging layer as a mask. For example, the material layer is a polysilicon layer to be patterned to form polysilicon gates. In another example, the material layer includes a dielectric layer to be patterned to form trenches for filling with interconnect material during a damascene process.

The imaging layer is a material sensitive to the radiation energy used by the maskless lithography apparatus for patterning. In one example, the radiation energy includes e-beam. In other embodiments, the radiation energy includes ion beam or UV beam. The forming of the imaging layer to a wafer can be implemented by a track unit, which is an integrated tool for various processes of the imaging layer. The wafer coated with the imaging layer may be further baked to partially remove the solvent from the imaging layer.

Still referring to FIGS. 6, the method 300 proceeds to step 304 by transferring the coated substrates from the track unit to a maskless lithography apparatus having multiple writing chambers and a single data path to provide a set of circuit pattern data for wafer patterning. The writing chambers each further includes a mechanism to provide multiple radiation beams for wafer writing. In one embodiment, the radiation beams include e-beams. The maskless lithography apparatus may be the apparatus describe with reference to FIG. 1, FIG. 4, or FIG. 5. In one example, the wafer 126 is transferred from the track unit to the maskless lithography apparatus through the interface 144 by the main robot and then further send to one of the writing chambers. When sending the wafer 126 to one of the writing chambers, the wafer is first sent to the associated loadlock chamber for pre-alignment and then to the wafer stage of the associated main chamber when the main chamber is available. In one embodiment, the wafer exchange between the main chamber and the loadlock chamber is very short because both chambers are in vacuum. The step 304 will be implemented until each of the main chambers receives a new wafer to be patterned. The configuration of the maskless lithography apparatus is designed to enable step 304 of transferring a new batch of wafers to be implemented partially in parallel with the scanning process to the previous batch of the wafers to increase the throughput. For example, when a coated wafer is transferred to the interface and then further transferred to a loadlock chamber while the previous batch of wafers are scanned in the main chamber. This step may further include other actions such as aligning, leveling and/or focusing. For example, a wafer can be pre-aligned at the associated loadlock chamber. In another example, the loadlock chamber and the main chamber are pumped down to a proper pressure level after the wafer has been transferred in the relevant chamber. In one embodiment, step 304 of wafer transferring is controlled in a time mode. For example, the wafer are transferred from the associated loadlock chambers to the associated main chambers at substantially same pace so that all the wafers to be scanned are ready for writing substantially at a same time for processing efficiency.

The method 300 proceeds to step 306 by providing a set of circuit pattern data to the maskless lithography apparatus from the data server through the data path. The set of circuit pattern data includes the information of the design pattern to be transferred on the imaging layers of the wafers to be scanned by the maskless lithography apparatus. The circuit pattern data may additionally include other image information, such as alignment mark, to be transferred to the imaging layers of the wafers. In various embodiments, the set of circuit pattern data (or a writing file) is proper format, such as GDSII format or simple bitmap format. In one embodiment, the data path includes an optic fiber to transfer the circuit pattern data. In another embodiment, the circuit pattern data may be first sent to a buffer database through the data path and then feed to the writing chambers to provide fine adjusting of the data feeding if the data transfer and the scanning are not at the same pace or have a mismatch therebetween.

In one embodiment, the method 300 proceeds to step 308 by simultaneously writing multiple wafers using the multi-beam modules according to the set of circuit pattern data provided by the data server through the data path at step 306. At this step 308, the plurality of writing chambers write to the wafers substantially synchronously in accordance with the same set of circuit pattern data. A clock signal may be also provided to the plurality of writing chambers to synchronize the writing processes of all writing chambers. Each writing chamber may additionally include a buffer to save at least a portion of the circuit pattern data in case the plurality of writing chambers may still experience minor scanning differences. Additionally, each writing chamber simultaneously writes to various regions (fields) of the wafer on the associated wafer stage utilizing the associated multi-beam module. In one embodiment, the multiple beams are aligned in a row each directed to one of fields in a row. Then the multi-beam module is stepped to the next row of the fields in the wafer for scanning. The scanning process is repeated until all fields of one wafer are scanned. The scanning process can be implemented in a proper mode. In one embodiment, the scanning process is implemented in a raster mode. In another embodiment, the scanning process may be implemented in a vector mode. In one embodiment, the method 300 further includes a fine alignment before the writing. In one embedment, each writing chamber performs a writing process according to the set of circuit pattern data from the data path and an individual correction file specific to the associated writing chamber. In one example, the correction file includes dose correction and/or overlay correction.

The steps 306 and 308 are implemented in parallel so that the data path continuously provides the circuit pattern data while the maskless lithography apparatus continuously scans the wafers according to the provided circuit pattern data. In one embodiment of implementing the method 300, the data communication cost is reduced and data transfer efficiency is enhanced thereby. The throughput of the wafer scanning is substantially improved. In another embodiment, step 304 for wafer transfer can also be implemented with steps 306 and 308. For example, various actions of step 304, such as wafer exchange from the interface to a loadlock chamber, vacuum pump down, and/or alignment can be implemented while steps 306 and 308 are being performed.

Figure 7:
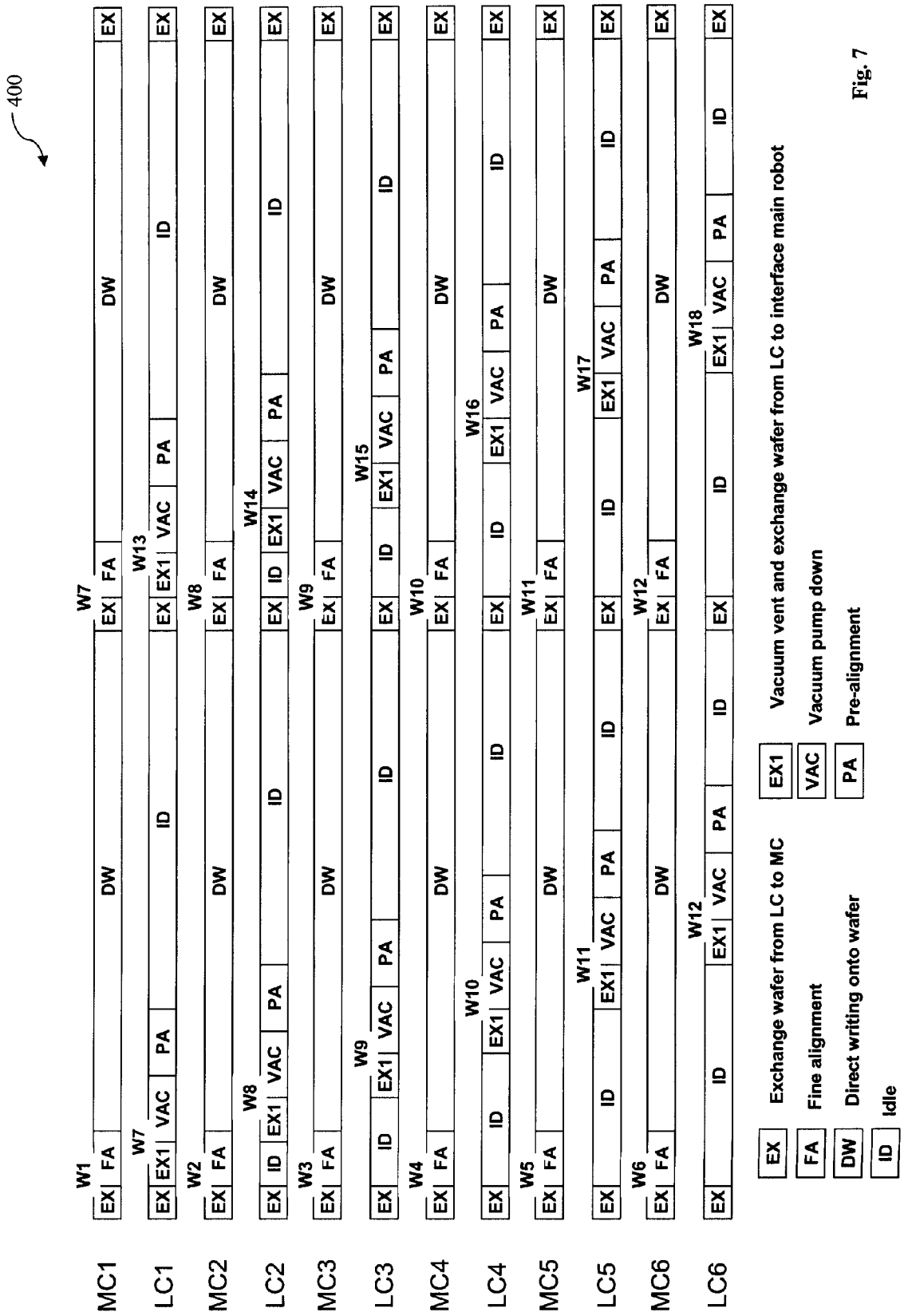
FIG. 7 is a timing diagram implemented in the method of FIG. 6 constructed according to one embodiment of the present disclosure.

In another embodiment, the method 300 further includes a synchronization process to synchronize the data loading, the radiation beam writings, and the wafer stage positioning. As one exemplary embodiment, FIG. 7 provides a clocking diagram 400 illustrating various actions in term of time. Each row represents one module, such as a main chamber or a loadlock chamber, and its sequential actions, such as wafer exchange, fine alignment, writing, pre-alignment, and/or vacuum pump down. Various rows are provided to illustrate the associated actions of various modules in parallel. For example, at the same location of the two rows, the associated two modules can be compare between the module actions occurring at that time. The clocking diagram 400 illustrates the processing time frame for the maskless lithography apparatus having 6 writing chambers. Each writing chamber has a main chamber and a loadlock chamber. The main chambers are, respectively, labeled in FIG. 7 as "MC1". "MC2", . . . , and "MC6". The loadlock chambers are, respectively, labeled in FIG. 7 as "LC1". "LC2", . . . , and "LC6". Three batch of wafers are in the maskless lithography apparatus, respectively labeled as "w1", "w2", . . . , and "w18". Each batch includes 6 wafers to be positioned at different writing chambers and scanned simultaneously. The various actions applied to wafers include "EX" for exchange wafer from a loadlock chamber to a main chamber, "EX1" for vacuum vent and exchange from the loadlock chamber to the main chamber, "FA" for fine alignment, "VAC" for vacuum pump down, "DW" for direct writing onto wafer (or writing), "PA" for pre-alignment, and "ID" for idle. The clock diagram only serves as an example to illustrate how the various processes are controlled in a time mode.

The method 300 may include other processing steps. As one example, after the writing, the scanned wafers are transferred from the writing chambers to the track unit through the loadlock chamber and the interface for the subsequent lithography process. For example, the scanned wafers are sent to the track unit for developing process to form the patterned imaging layer. Another baking process may be then applied to the wafers with the patterned imaging layer. Other processing steps may further follow. For example, the material layer of each wafer may be etched to transfer the pattern defined in the imaging layer to the material layer. In another embodiment, the material layer is implanted using the patterned imaging layer as an implant mask.

The present disclosure provides various embodiments of a maskless lithography apparatus and a method to utilize the lithography apparatus. Other variations may also be possible within the scope of the invention. In one embodiment, the maskless lithography apparatus includes a second data path in a way that the first data path and second data path are configurable such that the first data path provides a first set of circuit pattern data to each of the multiple radiation beams in at least two of the writing chambers and the second data path provides a second set of circuit pattern data to each of the multiple radiation beams in at least one other of the writing chambers. In furtherance of the embodiment, the maskless lithography apparatus includes multiple data paths in a way that each data path is configurable to provide one set of circuit pattern data to each of the multiple radiation beams in one or more writing chambers. At least one data path provides the respective set of circuit pattern data to at least two writing chambers. In this case, various wafer products can be simultaneously processed in this cluster lithography apparatus. The above described apparatus and the method provide a capability to run multiple products simultaneously in the maskless lithography apparatus. Particularly, the tool efficiency can be improved when some or all of the various wafer products have a small volume in the manufacturing process flow. For example, one or more wafer products may have small lots such as 10 or less wafers per lot, it may not achieve the full loading if only the wafers of a same product is simultaneously processed in the maskless lithography apparatus. By implementing the above apparatus and the method, the efficiency of the maskless lithography apparatus will not be degraded. For example, the maskless lithography apparatus has 10 writing chambers in cluster. The apparatus includes two data paths, each being linked to five chambers. Two different jobs can be run at the same time. In another embodiment of the method, the multiple writing chambers of the apparatus can be properly grouped in a way each group of the writing chambers being associated with one data path such that the processing flows of the writing chambers are matched for the efficiency of the apparatus. In this case, the processing mismatch due to the wafer products and/or the writing chambers can be compensated, the wafer idle time is minimized, and the wafer transfer time (loading and unloading time) will not be degraded by the mismatch. With the re-configurability of the multiple data paths, the multiple writing chambers can be dynamically regrouped according to wafer flow, product volume, and/or states of the writing chambers (such as some chambers down for repair or maintenance) to maximize the efficiency of the apparatus.

In another embodiment, various steps are implemented at least partially in parallel. In another embodiment, the maskless lithography apparatus is coupled to an intranet or the Internet and coupled with other portion of the integrated circuit manufacturer for processing control, routing, monitoring and/or engineer special handling. In another embodiment, with proper setup and matching corrections of the stage coordination and beam-to-beam deviation, the maskless lithography apparatus is able to use a same proximity effect corrected pattern data file. In another embodiment, various wafer stages can be an e-chuck, a ring stage, a vacuum stage or other suitable stage to secure a wafer and designed operable to manipulate the wafer in translational and rotational modes.

The present disclosure has been described relative to a preferred embodiment. Improvements or modifications that become apparent to persons of ordinary skill in the art only after reading this disclosure are deemed within the spirit and scope of the application. It is understood that several modifications, changes and substitutions are intended in the foregoing disclosure and in some instances some features of the invention will be employed without a corresponding use of other features. Accordingly, it is appropriate that the appended claims be construed broadly and in a manner consistent with the scope of the invention. It is understood that different embodiments disclosed herein offer different advantages, and that no particular advantage is necessarily required for all embodiments.

What is claimed is:

1. A maskless lithography apparatus, comprising:
a plurality of writing chambers, each including:
a substrate stage operable to secure a substrate to be written, the substrate stage positioned within a first chamber having a first gate providing access to the first chamber such that the first chamber has a first pressure;
a multi-beam module operable to provide multiple radiation beams each directed for writing a portion of the substrate; and
a load lock dedicated to serving the substrate stage and operable to provide the substrate to the substrate stage through the first gate, the load lock positioned within a second chamber adjacent the first chamber, the second chamber having a second gate providing access to the second chamber such that the second chamber has a second pressure;
an interface operable to transfer the substrate through the second gate to the load lock of the respective writing chamber, the interface having a third pressure such that the first pressure, the second pressure, and the third pressure are different;
a data path operable to provide a set of circuit pattern data to the multi-beam module of each of the writing chambers; and
a clock module operable to provide a clock signal to the multi-beam module of each of the writing chambers for synchronization.

2. The apparatus of claim 1, wherein the multiple radiation beams each comprises one of electron beam (e-beam), ultraviolet (UV) beam, and ion beam.

3. The apparatus of claim 1, wherein the load lock further comprises two additional substrate stages and two substrate transferring robots.

4. The apparatus of claim 1, wherein the interface is further coupled to a track unit for processing an imaging layer to the substrate.

5. The apparatus of claim 1, wherein the clock module comprises a clock wire to provide the clock signal to synchronize data loading, radiation beam writing, and substrate stage positioning.

6. The apparatus of claim 1, further comprising a buffer database operable to receive the set of circuit pattern data from the data path and provide the set of circuit pattern data to each of the multiple radiation beams during a writing process.

7. The apparatus of claim 1, further comprising a plurality of beam databases each coupled with one of the multiple radiation beams and operable to receive the set of circuit pattern data and provide the set of circuit pattern data to the respective one of the multiple radiation beams during a writing process.

8. The apparatus of claim 1, wherein the multi-beam module comprises an integrated structure with multiple micro-columns, each of the multiple micro-columns being operable to provide one of the multiple radiation beams.

9. The apparatus of claim 1, wherein the multi-beam module comprises a single column operable to provide the multiple radiation beams and to scan various fields of the substrate using the multiple radiation beams.

10. A maskless lithography apparatus, comprising:
    a plurality of writing chambers, each including:
        a wafer stage operable to secure a wafer to be written;
        a multi-beam module operable to provide multiple radiation beams for writing the wafer; and
        a load lock having a pre-alignment wafer stage operable to pre-align the wafer prior to the load lock providing the wafer to the wafer stage, wherein the wafer stage is provided the wafer only by the load lock;
    an interface operable to transfer wafers between each of the writing chambers and a track unit for processing an imaging layer to the wafers; and
    a data path operable to provide a set of circuit pattern data to each of the multiple radiation beams in at least two of the writing chambers.

11. The apparatus of claim 10, further comprising another data path operable to provide another set of circuit pattern data to each of the multiple radiation beams in at least one other of the writing chambers.

12. The apparatus of claim 10, wherein the data path is operable to provide the set of circuit pattern data to each of the multiple radiation beams in all of the writing chambers.

13. The apparatus of claim 10, wherein each of the writing chambers further comprises a load lock to transfer the wafer between the interface and the wafer stage of the respective writing chamber.

14. The apparatus of claim 13, wherein the load lock further comprises double wafer robots operable to manipulate two wafers at a same time.

15. The apparatus of claim 10, wherein the multi-beam module comprises a multi-beam column operable to provide the multiple radiation beams.

16. The apparatus of claim 10, wherein the multi-beam module comprises a structure integrated with multiple micro-columns each operable to provide one of the multiple radiation beams.

17. A method to pattern a first substrate and a second substrate, comprising:
    forming an imaging layer on each of the first and second substrates, the imaging layer being sensitive to a radiation energy;
    providing a maskless lithography apparatus including:
        first and second writing chambers each having:
            a multi-beam module configured to provide multiple radiation beams of the radiation energy, each of the multiple radiation beams being directed for writing a portion of a substrate;
            a substrate stage operable to secure the substrate to be written, the substrate stage in a first chamber; and
            a load lock dedicated to serving the substrate stage and operable to provide the substrate to the substrate stage, the load lock in a second chamber that is different than the first chamber;
        a data path configured to provide a set of circuit pattern data to the multi-beam module of each of the writing chambers;
    transferring the first substrate and the second substrate from the load lock to the multi-beam module of the first and second writing chambers, respectively, wherein the substrate stage of the first writing chamber receives the first substrate only from the load lock of the first writing chamber and the load lock of the first writing chamber only provides the first substrate to the substrate stage of the first writing chamber;
    providing the set of circuit pattern data through the data path to the multi-beam module of the first and second writing chambers; and
    simultaneously writing to the first and second substrates by the multi-beam modules of the first and second writing chambers, respectively, in accordance with the set of circuit pattern data.

18. The method of claim 17, wherein the radiation energy comprises an energy beam selected from the group consisting of electron beam, ion beam, and ultra-violet (UV) beam.

19. The method of claim 17, wherein the simultaneously writing comprises synchronizing the plurality of writing chambers for writing using a clock signal.

20. The method of claim 17, wherein the simultaneously writing comprises simultaneously writing various fields of the imaging layer on each of the substrates by the multiple radiation beams in accordance with the set of circuit pattern data.

* * * * *